United States Patent [19]

Tamura et al.

[11] 4,210,498
[45] Jul. 1, 1980

[54] METHOD OF INCREASING THE AMPLIFICATION OF A TRANSISTOR THROUGH USE OF ORGANIC COMPOUNDS

[75] Inventors: Tooru Tamura, Ikeda; Nobuyuki Ojima, Katano; Sigeru Kondo, Higashi-Osaka; Kenichirou Kishita, Kagoshima, all of Japan

[73] Assignee: Matsushita Electric Industrial Co., Ltd., Osaka, Japan

[21] Appl. No.: 629,907

[22] Filed: Nov. 7, 1975

[30] Foreign Application Priority Data

Nov. 20, 1974 [JP] Japan ............................ 49-134027
May 20, 1975 [JP] Japan ............................ 50-60748
May 19, 1975 [JP] Japan ............................ 50-60394
May 20, 1975 [JP] Japan ............................ 50-60747

[51] Int. Cl.² ............................................ C25D 5/36
[52] U.S. Cl. ..................................... 204/35 N; 357/8; 427/387; 427/443.2
[58] Field of Search ............ 357/72, 8; 427/52, 430 B, 427/387; 204/35 N

[56] References Cited

U.S. PATENT DOCUMENTS 3,284,202  11/1966  Leonard .................... 204/35 N UX
3,853,593  12/1974  Bauds et al. .................... 204/35 N Primary Examiner—Charles F. LeFevour
Attorney, Agent, or Firm—Wenderoth, Lind & Ponack

[57] ABSTRACT

A method of treating a semiconductor device comprising the step of dipping said semiconductor device into a solution of chelating agent selected from the group consisting of γ-pyrones, nitrated catechols, flavones and combinations thereof.

10 Claims, 5 Drawing Figures

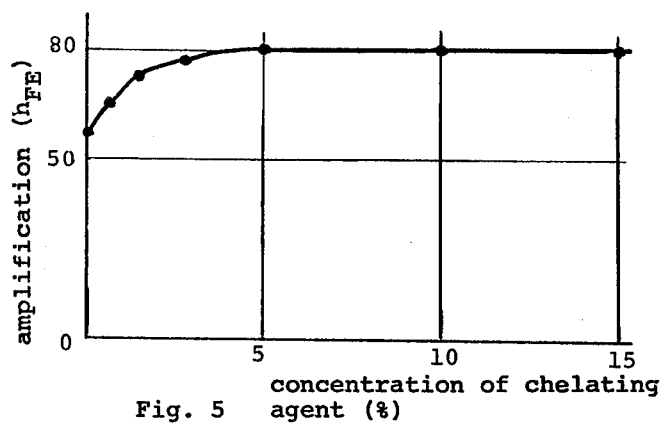

METHOD OF INCREASING THE AMPLIFICATION OF A TRANSISTOR THROUGH USE OF ORGANIC COMPOUNDS

This invention relates to a method of treating a semiconductor device, and more particularly to a method of treating a semiconductor device to improve the characteristics thereof, especially amplification ($h_{FE}$) thereof.

In order to improve the characteristics of a semiconductor device such as a transistor, various methods have been developed in the prior art. For example, to stabilize the characteristics of a transistor, especially a silicon transistor, various passivation techniques such as the forming of a silicon nitrate or silcon dioxide layer have been used. However, because these techniques require a high temperature up to hundreds of degrees centigrade, they can not be applied to a germanium transistor and a compound semiconductor which are degenerated by heating. Further, these conventional methods have complicated steps and thus need complicated apparatus which results in high cost. Therefore, there is a great need for a treatment which can be employed at a temperature as low as room temperature without expensive apparatus.

Therefore, an object of the present invention is to provide an novel and improved method for treating a semiconductor device via surface treatment utilizing a low temperature passivation to improve and stabilize the electrical characteristics of the device.

Another object of the invention is to provide a method for treating a transistor with reduced surface recombination velocity of the carrier and holes for obtaining high amplification.

A futher object of the present invention is to provide a method of treating a p-n-p type transistor which has low noise level with high p-n junction impedance.

These objects are achieved by providing the method of treating a semiconductor device according to the present invention, which comprises a step of dipping said semiconductor device in a solution of a chelating agent selected from the group consisting of $\gamma$-pyrones, nitrated catechols, flavone and combinations thereof.

These and other objects and the features of the present invention will be apparent upon consideration of the following description taken together with accompanying the drawings, in which:

FIG. 5 is a graph showing a relation between $h_{FE}$ and the concentration of chelating agent used in the present invention.

Figure 1:
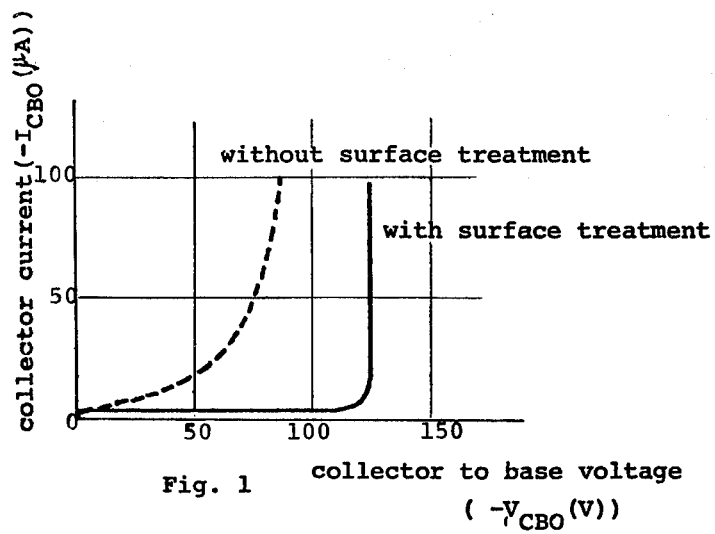
FIG. 1 is a graph showing the relation between collector to base voltage and collector current of a transistor, to demonstrate the effects of the present invention.

The method of the invention can be applied to any kind of semiconductive device, and the effect of the method is especially large for a germanium transistor and a compound semiconductor for which it is difficult to form a stable oxide protective layer. Now, in the following, an embodiment of the invention will be described for an example of a germanium transistor such as a germanium PNP alloy junction transistor such as 2SB-172 of Matsushita Electronics Corporation of Japan.

The transistor 2SB-172 consists essentially of n-type germanium and indium as major elements with additive elements of antimony and barium, and it is manufuctured by an alloying method. For such a germanium transistor, it is difficult to get stable electrical characteristics without treating the surface of the transistor. In such a transistor, minority carriers are holes, and the life time of the hole is thought to have an intimate relation to the surface state of the transistor.

It is well known that chelating agents such as $\gamma$-pyrones, flavonoids and catechols, which have adjacent substituents, such as —OH and —OH, or —OH and C=O, react easily with the germanium ion. In experiments, the inventors have found that surface treatment of a transistor with these chelating agents results in higher amplification ($h_{FE}$). That is, according to the surface treatment, the amplification ($h_{FE}$) of the transistor is increased more than twice the amplification of the transistor which is not processed by such surface treatment. Further, the increase of the amplification is realized without reducing the other electric characteristics of the transistor. It is also found that presence of a certain concentration of $H^+$ ion is desirable for the surface treatment by these chelating agents. For example, in the case of $\gamma$-pyrones, the favorable pH value for the surface treatment of the transistor is below 7, and so $\gamma$-pyrones is applied on the transistor together with oleic acid. For some flavonoids such as rutin, naringenin and hesperidin, it is desirable that these agents be processed in alkaline condition.

The surface treatment of the germanium transistor with the chelating agents described above can be effectively carried out by anodically electrolysing the transistor in potassium hydroxide solution before the treatment. After that, the transistor is rinsed and immersed into alcohol, and then the transistor is immersed into alcohol solution of the chelating agent while the surface of the transistor is still wet.

The chelating agents are thought to react easily with the anode etched germanium surface, because many reactive sites are produced on the surface of the transistor by etching. It is thought that the thus reacted chelating agents attract electrons of germanium to produce positive charges and to reduce the surface recombination velocity of the carriers (holes), and therefore the transistor provides high amplification.

The amplification ($h_{FE}$) of the thus reacted germanium transistor is more than 90, and the p to n juntion impedance of the reacted transistor remains at a high value e.g. 120 volts. In case of the germanium transistor which has surface not received treatment, $h_{FE}$ is 35 and the p to n junction impedance is 80 volts. The amplification ($h_{FE}$) of the transistor is defined according to the equation $h_{FE}=Ic/Ib$, where Ib is a base current and Ic is a collector current. In case of the germanium PNP alloy transistor 2SB172, the amplification $h_{FE}$ is defined at the conditions of base current of 2mA ($-I_B=2mA$) and voltage of 1 volt applied between emitter and collector ($-V_{CE}=1V$), and for the p to n junction impedance, an applied voltage at which the current of $-100$ micro ampere is observed is adopted as the substitution of the impedance.

Figure 2:
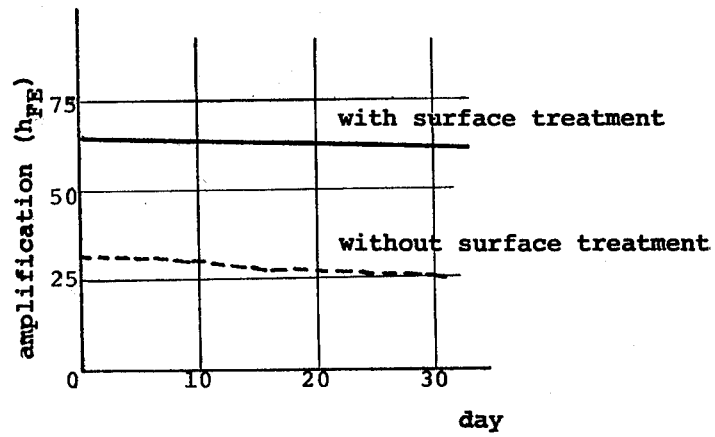
FIG. 2 is a graph showing a change of an amplification of a transistor against time to demonstrate the present invention.

FIGS. 1 and 2 are graphs depicting the characteristics of the germanium transistor 2SB172 which is processed with the the present invention comparing it with the same type transistor which is not processed with the present invention. That is, FIG. 1 shows the relationship between collector to base voltage ($-V_{CBO}$) and a collector current ($-I_{CBO}$) of these transistors, and FIG. 2 shows a change of the amplification of these transistors when they are left at room temperature. It is understood that the amplification is increased nearly two fold and it changes little on aging, and in addition the voltage withstanding is much improved.

For the surface treatment of the invention, it is preferred that the solution of the chelating agent further contains thermosetting silicone resin vehicles. After the transistor is immersed in this solution, it is baked so as to cure the resin. In this case, methyl alcohol, toluene or xylene is used as a preferrable solvent for the silicon resin vehicles. As a preferred solvent for the chelating agent, dioxane is used as it readily dissolves the chelating agent used in the method of the invention and in addition it results in well voltage withstanding characteristic of the germanium transistor.

An embodiment of the invention is described in more detail in the following examples, in which the transistor used for evaluating the electric characteristics is the germanium PNP alloy transistor 2SB-172 of Matsushita Electronics Corporation, as described hereinbefore, and the values of amplification, base to collector impedance and noise level are the mean values of the 10 transistors.

EXAMPLE 1

The transistor 2SB-172 was anodically electrolysed in 5% potassium hydroxide solution with a current density of 20 mA/cm$^2$ for one minute, and after that, the transistor was rinsed with plenty of running distilled water. Then, the transistor was dipped in a solution having the following composition:

| oxalic acid | 3 (parts by weight) |
| --- | --- |
| kojic acid (5-hydroxy-2-hydroxymethyl-γpyrone) | 1 |
| dioxane | 54 |
| methylalcohol | 6 |
| ES-1001N (Silicon resin modified with epoxy resin) | 20 |

The thus treated transistor was baked for 4 hours at 90° C. The resultant transistor had the amplification of 100, and the base to collector impedance of the transistor remained at 130 volts. Noise level of the transistor was below 2 mV. The same type transistor which was not dipped in the solution was found to be 35 in amplification and showed an unstable base to collector impedance of less than 80 volts. Noise level was about 30 mV.

EXAMPLE 2

The transistor 2SB-172 was anodically electrolysed in 5% potassium hydroxide solution with a current density of 20mA/cm$^2$ for one minute, and after that, the transistors was rinsed with plenty of running distilled water. Then, the transistor was dipped in a solution having the following composition:

| 3,4-di-nitrocatechol | 2 |
| --- | --- |
| dioxane | 54 |
| xylene | 6 |
| ES-1001N | 20 |

The thus treated transistor was baked for 4 hours at 120° C. The amplification of the resultant transistor was 85, and the base to collector impedance remained at 120 volts. Noise level of the transistor was below 3 mV.

EXAMPLE 3

The transistor 2SB-172 was anodically electrolysed in 5% potassium hydroxide solution with the current density of 20 mA/cm$^2$ for one minute, and after that the transistor was rinsed with plenty of running distilled water. Then, the transistor was dipped in a solution having the following composition:

| 4-nitro catechol | 0.5 |
| --- | --- |
| dioxane | 54 |
| xylene | 6 |
| ES-1001N | 20 |

The thus treated transistor was baked for 4 hours at 100° C. The amplification of the resultant transistor was 80, and the base to collector impedance remained at 110 volts. Noise level of the transistor was below 5 nV,

EXAMPLE 4

The transistor 2SB-172 was anodically electrolysed in 5% potassium hydroxide solution with the current density of 20mA/cm$^2$ for one minute, and after that, the transistor was rinsed with plenty of running distilled water. Then, the transistor was dipped in a solution having the following composition:

| 3-nitrocatechol | 3 |
| --- | --- |
| dioxane | 54 |
| xylene | 6 |
| ES-1001N | 20 |

The thus treated transistor was baked for 4 hours at 80° C. The amplification of the resultant transistor was 75, and the base to collector impedance remained at 110 volts. Noise level of the transistor was below 3 mV.

EXAMPLE 5

The transistor 2SB-172 was anodically electrolysed in 5% potassium hydroxide solution with the current density of 20 mA/cm$^2$ for one minute, and after that, the transistor was rinsed with plenty of running distilled water. Then, the transistor was dipped in a solution having the following composition:

| quercetin | 0.4 |
| --- | --- |
| methylalcohol | 80 |
| FS-1056A (Thermosetting silicone) | 20 |

The thus treated transistor was baked for 4 hours at 80° C. The amplification of the resultant transist was 80, and the base to collector impedance remained at 125 volts. Noise level of the transistor was below 10 mV.

EXAMPLE 6

The transistor 2SB-172 was anodically electrolysed in 5% potassium hydroxide solution with the current density of 20mA/cm² for one minute, and after that the transistor was rinsed with plenty of running distilled water. Then, the transistor was dipped in a solution having the following composition:

| rutin | 0.4 |
|---|---|
| methylalcohol | 80 |
| FS-1056A | 20 |

The thus treated transistor was baked for 4 hours at 90° C. The amplification of the resultant transistor was 65, and the base to collector impedance stably remained at 65 volts. Noise level of the transistor was below 6 mV.

EXAMPLE 7

The transistor 2SB-172 was anodically electrolysed in 5% potassium hydroxide solution with the current density of 20 mA/cm² for one a minute, and after that, the transistor was rinsed with plenty of running distilled coater. Then, the transistor was dipped in a solution having the following composition:

| flavanol | 0.4 |
|---|---|
| methyl alcohol | 80 |
| ES-1000N | 20 |

The thus treated transistor was baked for 4 hours at 100° C. The amplification of the resultant transistor was 65, and the base to collector impedance stably remained at 60 volts. Noise level of the transistor was below 8 mV.

The thus produced transistors had an amplification 1.0 to 2.6 times larger than that of the transistor which was not processed with the surface treatment according to the invention.

Figure 3:
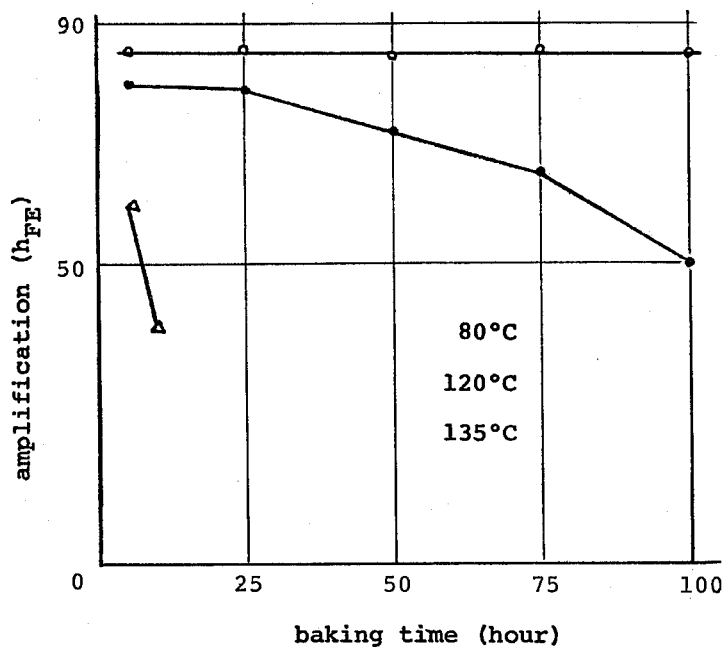
FIG. 3 is a graph showing an amplification ($h_{FE}$) of a transistor as a function of baking temperature and baking time in the present invention.

In the above described examples, the effects of the conditions of the treatment such as baking temperature and the concentration were also studied. FIG. 3 shows an amplification ($h_{FE}$) as a function of the baking temperature and the baking time. As shown in FIG. 3, the baking temperature has an effect on the stability of the amplification ($h_{FE}$) and the preferred temperature is in the range from 80° to 120° C.

Figure 4:
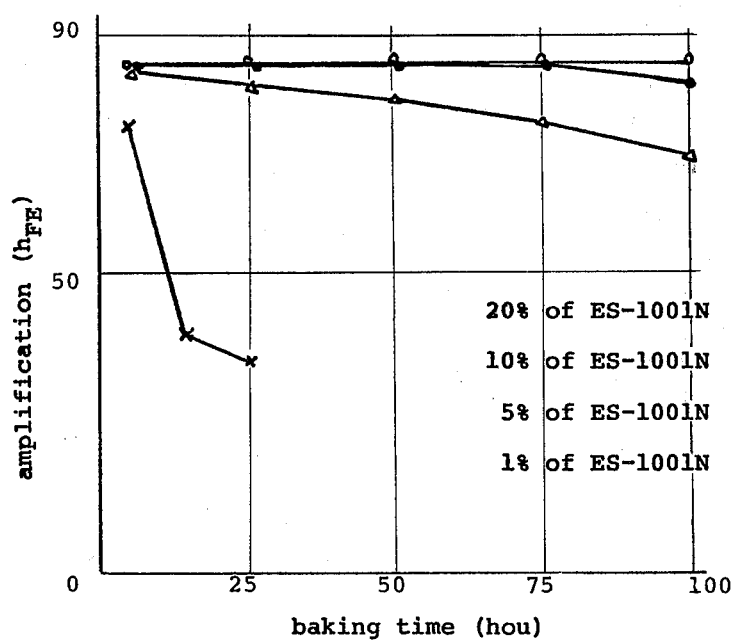
FIG. 4 is a graph showing an amplification ($h_{FE}$) of a transistor function of the concentration of the resin vehicle added to the solution used in the present invention.

FIG. 4 shows the amplification ($h_{FE}$) as a function of the concentration of the resin vehicles added to the solution and the baking time, while the baking temperature is 120° C. As shown in FIG. 2, the preferred concentration of the resin vehicles is in the range from 5 to 20% of the solution.

FIG. 5 shows the relation between $h_{FE}$ and the concentration of the chelating agent for the resin vehicles. As shown in FIG. 3, the preferred concentration of the chelating agent is above 2% of the resin vehicles. The relations shown in the graphs of FIGS. 3 to 5 are observed with use of 3,4-di-nitrocatechol as a chelating agent, but other agents show the same tendency.

What is claimed is:

1. A method of treating a germanium transistor in which the minority carriers are holes, comprising:
    1. anodically electrolysing said transistor in an alkali solution;
    2. then dipping the transistor into an organic solution comprising a chelating agent, a thermosetting silicone resin and an organic solvent, said chelating agent being selected from the group consisting of Y-pyrones, nitrated catechols, flavones and combinations thereof; and
    3. baking the thus treated transistor to cure said thermosetting silicone resin.

2. A method of treating a transitor as claimed in claim 1, wherein said anodically electrolysing step is carried out with a current density of nearly 20 mA/cm² for a few minutes.

3. A method of treating a transitor as claimed in claim 1, wherein said chelating agent of Y-pyrones is an ortho-keto-ol derivative thereof.

4. A method of treating a transitor as claimed in claim 1, wherein said chelating agent of nitrated catechols is a member selected from the group consisting of 3-nitro-catechol, 4-nitro-catechol, 3,4-di-nitro-catechol, 4,5-di-nitro-catechol and combinations thereof.

5. A method of treating a transitor as claimed in claim 1, wherein said solution comprises dioxane as a solvent for said chelating agent.

6. A method of treating a transitor as claimed in claim 1, wherein said solution contains a solvent selected from the group consisting of methyl alcohol, toluene and xylene, to dissolve said silicone resins.

7. A method of treating a transitor as claimed in claim 1, wherein the concentration of said silicone resins is 5 to 20% of said solution.

8. A method of treating a transitor as claimed in claim 1, wherein a concentration of said chelating agent is more than 2% of said silicone resins.

9. A method of treating a transitor as claimed in claim 1, wherein said transitor is baked at a temperature from 80° to 120° C.

10. A method of treating a semiconductor as claimed in claim 1 wherein the transistor is a germanium PNP alloy junction transistor.

* * * * *